US011527423B2

(12) United States Patent
Park et al.

(10) Patent No.: US 11,527,423 B2
(45) Date of Patent: Dec. 13, 2022

(54) SETTING METHOD FOR SUBSTRATE PROCESSING APPARATUS

(71) Applicant: SEMES CO., LTD., Chungcheongnam-do (KR)

(72) Inventors: Tae Hyun Park, Seongnam-si (KR); Jae Young Jang, Chungcheongnam-do (KR); Kook Bong Lee, Gyeonggi-do (KR)

(73) Assignee: SEMES CO., LTD., Chungcheongnam-Do (JP)

( * ) Notice: Subject to any disclaimer, the term of this patent is extended or adjusted under 35 U.S.C. 154(b) by 0 days.

(21) Appl. No.: 17/501,569

(22) Filed: Oct. 14, 2021

(65) Prior Publication Data
US 2022/0122854 A1 Apr. 21, 2022

(30) Foreign Application Priority Data

Oct. 15, 2020 (KR) .................. 10-2020-0133206

(51) Int. Cl.
*B41J 2/045* (2006.01)
*H01L 21/67* (2006.01)
*B41J 11/46* (2006.01)
*B41J 11/00* (2006.01)

(52) U.S. Cl.
CPC ...... *H01L 21/6715* (2013.01); *B41J 2/04505* (2013.01); *B41J 11/008* (2013.01); *B41J 11/46* (2013.01)

(58) Field of Classification Search
CPC ...... B41J 2/04505; B41J 2/04558; B41J 2/01; B41J 11/008; B41J 11/46; B41J 11/0095; B41J 3/46; B41J 29/18; B41J 2/04586; B41J 3/28; B41J 3/407; G02F 1/133308; G02F 1/133322; H01L 51/0005; H01L 51/0031
See application file for complete search history.

(56) References Cited

U.S. PATENT DOCUMENTS

2014/0184683 A1* 7/2014 Harjee ................ B41J 2/04581
347/14
2015/0298153 A1* 10/2015 Baker .................... B41J 2/2135
118/712
2018/0229497 A1* 8/2018 Darrow ................ B41J 2/2135

FOREIGN PATENT DOCUMENTS

KR     100662564 B1   12/2006
KR   1020110028895 A    3/2011
KR     101174860 B1    8/2012

* cited by examiner

Primary Examiner — Kristal Feggins
(74) Attorney, Agent, or Firm — Procopio, Cory, Hargreaves & Savitch LLP

(57) ABSTRACT

A method for setting a substrate processing apparatus having a head for dispensing ink includes aligning a position of at least one vision unit, by moving the vision unit above a reference mark and taking, by the vision unit, an image of the reference mark, in which the vision unit takes an image of a substrate, and the reference mark is made on the substrate processing apparatus and fixed in one position, and aligning at least one of a movement axis of the vision unit, a position of the substrate, or a movement axis of the substrate, by moving the vision unit or the substrate in a state in which the substrate having alignment marks made thereon is located under the vision unit and taking, by the vision unit, an image of the alignment marks.

20 Claims, 13 Drawing Sheets

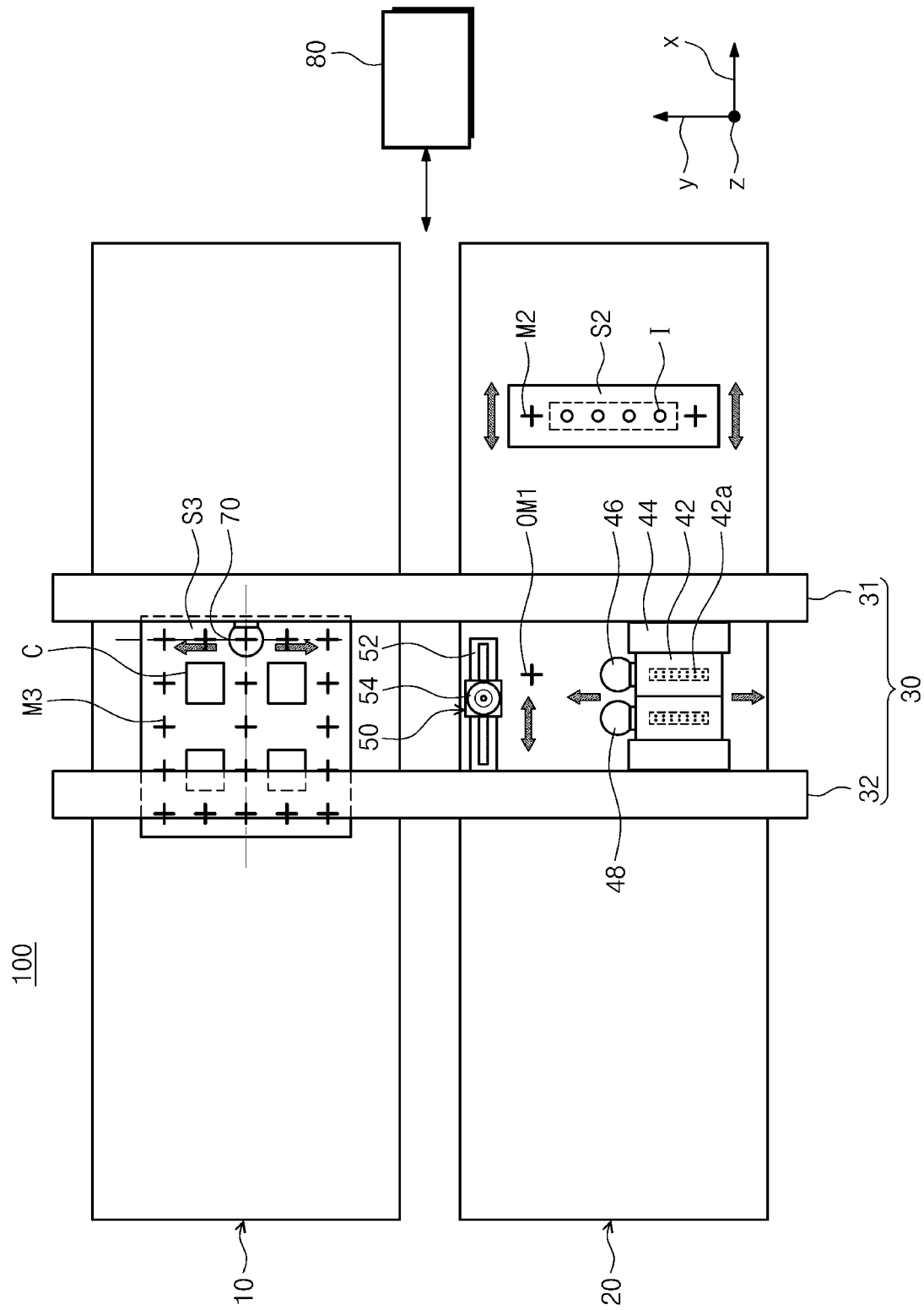

SETTING METHOD FOR SUBSTRATE PROCESSING APPARATUS

CROSS-REFERENCE TO RELATED APPLICATIONS

A claim for priority under 35 U.S.C. § 119 is made to Korean Patent Application No. 10-2020-0133206 filed on Oct. 15, 2020, in the Korean Intellectual Property Office, the entire contents of which are hereby incorporated by reference.

BACKGROUND

Embodiments of the inventive concept described herein relate to a setting method for a substrate processing apparatus.

Display elements, such as a liquid crystal display element, an organic EL display element, and the like, are required to have a high resolution. To manufacture a high-resolution display element, more pixels per unit area have to be formed on a substrate, and it is important to accurately dispense a processing liquid, such as ink, onto each of the densely arranged pixels. Otherwise, the display element may be determined to be defective. According to the related technologies, it is required to accurately manage the dispensing position of a processing liquid dispensed onto each of pixels in manufacture of a display element.

A general inkjet apparatus includes various components to determine a dispensing point of a processing liquid dispensed by a head, the amount of the processing liquid dispensed, and whether nozzles formed in the head are aligned. For example, the general inkjet apparatus includes a camera that identifies droplets of the processing liquid dispensed by the head and a camera that determines whether the nozzles of the head are aligned. The positions of the cameras included in the general inkjet apparatus are changed as needed. For example, the cameras are coupled to the head and moved together with the head, or are linearly moved by a separate LM guide. As described above, it is required to accurately manage the dispensing position of a processing liquid dispensed onto each of pixels in manufacture of a display element, and to this end, it is important to accurately set the positions and movement axes of the cameras in advance.

SUMMARY

Embodiments of the inventive concept provide a substrate processing apparatus setting method for aligning positions and/or movement axes of vision units of a substrate processing apparatus to enable the vision units to accurately obtain images.

Furthermore, embodiments of the inventive concept provide a substrate processing apparatus setting method for accurately setting vision units of a substrate processing apparatus and correcting a control signal of a head through images obtained by the vision units.

The technical problems to be solved by the inventive concept are not limited to the aforementioned problems, and any other technical problems not mentioned herein will be clearly understood from the following description by those skilled in the art to which the inventive concept pertains.

According to an embodiment, a method for setting a substrate processing apparatus having a head for dispensing ink includes aligning a position of a first vision unit, by moving the first vision unit above a reference mark and taking, by the first vision unit, an image of the reference mark, in which the first vision unit identifies ink droplets dispensed by the head, and the reference mark is made on the substrate processing apparatus and fixed in one position, and aligning positions of the first vision unit and a second vision unit and/or movement axes of the first vision unit and the second vision unit by taking, by the first vision unit and the second vision unit, an image of alignment marks, in which the second vision unit identifies the ink droplets dispensed by the head and is disposed side by side with the first vision unit, and the alignment marks are made on a first substrate moved in a first direction and are spaced apart from each other in the first direction and/or a second direction perpendicular to the first direction when viewed from above.

According to an embodiment, by moving the first substrate in the first direction and taking, by the first vision unit and the second vision unit, an image of the alignment marks made in the first direction, the positions of the first vision unit and the second vision unit may be aligned such that the first vision unit and the second vision unit are arranged in the first direction.

According to an embodiment, the movement axes of the first vision unit and the second vision unit may be aligned in the second direction, by moving the first vision unit and the second vision unit and taking, by the first vision unit and the second vision unit, an image of the alignment marks made in the second direction.

According to an embodiment, the first vision unit and the second vision unit may be installed on the head, and the method may further include moving the head above a nozzle alignment unit including a third vision unit that identifies states of nozzles formed in the head and a moving rail that moves the third vision unit, taking, by the third vision unit, an image of the nozzles while moving in a lengthwise direction of the moving rail, and aligning a movement axis of a third vision unit in the first direction or the second direction.

According to an embodiment, the head may dispense the ink droplets onto a second substrate while moving in the second direction, and the method may further include determining whether the ink droplets are arranged in the second direction, by taking, by the first vision unit and/or the second vision unit, an image of the ink droplets while moving in the second direction, and aligning at least one of a position of the second substrate or a movement axis of the second substrate such that an arrangement direction of the ink droplets coincides with the second direction.

According to an embodiment, the method may further include moving the second substrate below a fourth vision unit that identifies the ink droplets, taking, by the fourth vision unit, an image of the ink droplets, and aligning a movement axis of the fourth vision unit in the second direction.

According to an embodiment, the first substrate may be provided on a printing area where the head dispenses the ink to perform a printing process, and the second substrate may be provided on a maintenance area where maintenance of the head is performed.

According to an embodiment, the reference mark may be made on the maintenance area.

According to an embodiment, the printing area and the maintenance area may be arranged in the section direction.

According to an embodiment, a method for setting a substrate processing apparatus including a printing area, a maintenance area disposed side by side with the printing area in a second direction when viewed from above, a head that moves between the printing area and the maintenance area and dispenses ink droplets, a first vision unit that is coupled with the head and that identifies the ink droplets dispensed by the head, and a second vision unit that is coupled with the head so as to be disposed side by side with the first vision unit and that identifies the ink droplets dispensed by the head includes aligning a position of the first vision unit, by moving the first vision unit above a reference mark and taking, by the first vision unit, an image of the reference mark, in which the reference mark is made on the printing area or the maintenance area and fixed in one position, and aligning positions of the first vision unit and the second vision unit and/or movement axes of the first vision unit and the second vision unit by taking, by the first vision unit and the second vision unit, an image of alignment marks, in which the alignment marks are made on a first substrate moved in a first direction perpendicular to the second direction when viewed from above and are spaced apart from each other in the first direction and the second direction.

According to an embodiment, by moving the first substrate in the first direction and taking, by the first vision unit and the second vision unit, an image of the alignment marks made in the first direction, the positions of the first vision unit and the second vision unit may be aligned such that the first vision unit and the second vision unit are arranged in the first direction.

According to an embodiment, the movement axes of the first vision unit and the second vision unit may be aligned in the second direction, by moving the first vision unit and the second vision unit and taking, by the first vision unit and the second vision unit, an image of the alignment marks made in the second direction.

According to an embodiment, the substrate processing apparatus may further include a nozzle alignment unit including a third vision unit that identifies states of nozzles formed in the head and a moving rail that moves the third vision unit, and the method may further include moving the head above the nozzle alignment unit, taking, by the third vision unit, an image of the nozzles while moving in a lengthwise direction of the moving rail, and aligning a movement axis of the third vision unit in the first direction.

According to an embodiment, the head may dispense the ink droplets onto a second substrate while moving in the second direction, and the method may further include determining whether the ink droplets are arranged in the second direction, by taking, by the first vision unit and the second vision unit, an image of the ink droplets while moving in the second direction, and aligning at least one of a position of the second substrate or a movement axis of the second substrate such that an arrangement direction of the ink droplets coincides with the second direction.

According to an embodiment, the method may further include moving the second substrate below a fourth vision unit that identifies the ink droplets, taking, by the fourth vision unit, an image of the ink droplets, and aligning a movement axis of the fourth vision unit in the second direction.

According to an embodiment, the second substrate may be provided on the maintenance area, and the first substrate may be provided on the printing area.

According to an embodiment, a method for setting a substrate processing apparatus having a head for dispensing ink includes aligning a position of at least one vision unit, by moving the vision unit above a reference mark and taking, by the vision unit, an image of the reference mark, in which the vision unit takes an image of a substrate, and the reference mark is made on the substrate processing apparatus and fixed in one position, and aligning at least one of a movement axis of the vision unit, a position of the substrate, or a movement axis of the substrate, by moving the vision unit or the substrate in a state in which the substrate having alignment marks made thereon is located under the vision unit and taking, by the vision unit, an image of the alignment marks.

According to an embodiment, the substrate may further include a plurality of cells, and at least one of the alignment marks may be made between the plurality of cells when viewed from above.

According to an embodiment, the alignment marks may be arranged in a first direction in which the substrate is transported and a second direction perpendicular to the first direction when viewed from above, and the vision unit may include a plurality of vision units arranged in the second direction.

According to an embodiment, the reference mark may be made by a project beam.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 13 is a view illustrating a state in which a step of aligning a movement axis of the fifth vision unit is performed in the substrate processing apparatus of FIG. 9.

DETAILED DESCRIPTION

Figure 1:
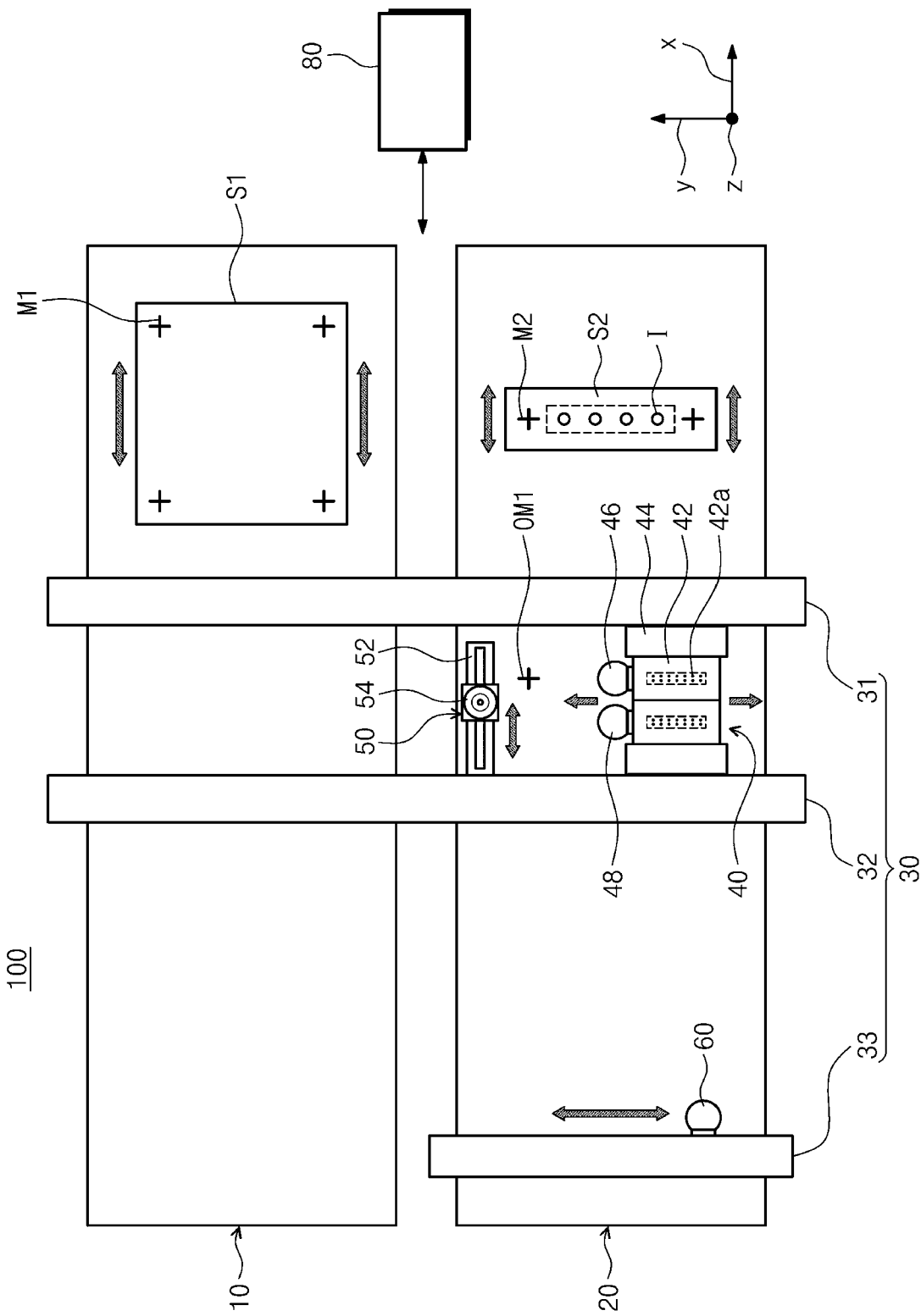
FIG. 1 is a view illustrating a substrate processing apparatus according to an embodiment of the inventive concept.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

The terms such as first, second, and the like may be used to describe various components, but the components should not be limited by the terms. The terms may be used only for distinguishing one component from others. For example, without departing the scope of the inventive concept, a first component may be referred to as a second component, and similarly, the second component may also be referred to as the first component.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

Unless otherwise defined, all terms used herein, including technical or scientific terms, have the same meanings as those generally understood by those skilled in the art to which the inventive concept pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, embodiments of the inventive concept will be described in detail with reference to FIGS. 1 to 13.

FIG. 1 is a view illustrating a substrate processing apparatus according to an embodiment of the inventive concept. Referring to FIG. 1, the substrate processing apparatus 100 according to the embodiment of the inventive concept may be an inkjet apparatus that processes a substrate by dispensing a processing liquid, such as ink, onto the substrate. For example, the substrate may be a glass substrate. The substrate processing apparatus 100 may perform a printing process on the glass substrate by dispensing ink droplets onto the glass substrate.

The substrate processing apparatus 100 may include a printing area 10, a maintenance area 20, a gantry 30, a head unit 40, a nozzle alignment unit 50, and a controller 80.

The printing area 10 may be disposed such that the lengthwise direction thereof is parallel to a first direction X when viewed from above. Hereinafter, a direction perpendicular to the first direction X when viewed from above is referred to as a second direction Y, and a direction perpendicular to the first direction X and the second direction Y when viewed from above is referred to as a third direction Z. The third direction Z may be a direction perpendicular to the ground. Furthermore, the first direction X may be a direction in which a first substrate S1 to be described below is transported.

In the printing area 10, the head unit 40 to be described below may perform a printing process on the first substrate S1 by dispensing ink droplets onto the first substrate S1. According to an embodiment, a first alignment mark M1 may be made on the first substrate S1. For example, a plurality of first alignment marks M1 may be made on the first substrate S1. The first alignment marks M1 may be made on the first substrate S1 so as to be spaced apart from each other in the first direction X and/or the second direction Y. For example, four first alignment marks M1 may be made on the first substrate S1, and the first alignment marks M1 may be made on areas adjacent to the corners of the first substrate S1.

The first substrate S1 transported in the printing area 10 may remain levitated. Accordingly, a levitation stage capable of levitating the first substrate S1 during transportation of the first substrate S1 may be provided in the printing area 10. Furthermore, a transport unit that holds one side or opposite sides of the first substrate S1 and transports the first substrate S1 may be additionally provided in the printing area 10. The mentioned transport unit may include a guide rail provided along one side or opposite sides of the levitation stage and a gripper sliding along the guide rail in the state of gripping the one side or the opposite sides of the first substrate S1. Furthermore, a substrate transported in the printing area 10, for example, the first substrate S1 may be transported in the first direction X.

In the maintenance area 20, maintenance of the head unit 40 to be described below may be mainly performed. The maintenance area 20 may be disposed side by side with the printing area 10. For example, the maintenance area 20 and the printing area 10 may be arranged side by side in the second direction Y.

According to an embodiment, a first reference mark OM1 may be made on the maintenance area 20. The first reference mark OM1 may be a mark made on the maintenance area 20 of the substrate processing apparatus 100 and fixed in one position. Although FIG. 1 illustrates an example that one first reference mark OM1 is made on the maintenance area 20, the number of first reference marks OM1 is not limited, and various numbers of first reference marks OM1 may be provided as long as a setting method for the substrate processing apparatus 100 is able to be performed. Furthermore, the first reference mark OM1 may be made at a position where origin alignment of a first vision unit 46 or a second vision unit 48, which will be described below, is able to be performed.

In the maintenance area 20, the head unit 40 to be described below may dispense, onto a second substrate S2, ink droplets for correction of a dispensing point of the head unit 40. For example, the head unit 40 may dispense ink droplets I onto the second substrate S2 while moving in the second direction Y. The ink droplets I dispensed onto the second substrate S2 may be used to correct the dispensing point of the head unit 40. According to an embodiment, the second substrate S2 may have a different shape from the first substrate S1. For example, the second substrate S2 may have a rectangular structure in which short sides are oriented in the first direction X and long sides are oriented in the second direction Y. Furthermore, a second alignment mark M2 may be selectively made outside the area where the ink droplets I are dispensed. A plurality of second alignment marks M2 may be made on the second substrate S2 so as to be spaced apart from each other in the second direction Y.

The maintenance area 20 may have a process environment the same as, or similar to, that of the printing area 10 because the ink droplets I for correction of dispensing points of ink droplets dispensed by the head unit 40 are able to be dispensed even in the maintenance area 20. Accordingly, a levitation stage capable of levitating the second substrate S2 during transportation of the second substrate S2 and a transport unit capable of transporting the second substrate S2 may be provided in the maintenance area 20. Furthermore, a substrate transported in the maintenance area 20, for example, the second substrate S2 may be transported in the first direction X.

The gantry 30 may linearly reciprocate the head unit 40 to be described below or a fourth vision unit 60 to be described below. The gantry 30 may include a first gantry 31, a second gantry 32, and a third gantry 33. The first gantry 31 and the second gantry 32 may have a structure extending along the printing area 10 and the maintenance area 20. The first gantry 31 and the second gantry 32 may be spaced apart from each other in the first direction X. That is, the first gantry 31 and the second gantry 32 may have a structure extending in the second direction Y, in which the printing area 10 and the maintenance area 20 are disposed, such that the head unit 40 to be described below moves in the second direction Y.

The third gantry 33 may have a structure extending in the second direction Y toward the printing area 10. That is, the third gantry 33 may have a structure extending in the second direction Y such that the fourth vision unit 60 to be described below moves in the second direction Y.

The head unit 40 may dispense ink drops onto a substrate. The head unit 40 may include a head 42, a head frame 44, the first vision unit 46, and the second vision unit 48. A plurality of nozzles 42a that dispense ink droplets may be formed in the head 42. The head 42 may be movably coupled to the first gantry 31 and the second gantry 32 through the head frame 44. For example, the head 42 may be movable in the second direction Y that is the lengthwise direction of the first gantry 31 and the second gantry 32. The head 42 may linearly reciprocate between the printing area 10 and the maintenance area 20 in the second direction Y that is the lengthwise direction of the first gantry 31 and the second gantry 32. The first vision unit 46 and the second vision unit 48 may be coupled to one side of the head 42 when viewed from above. The first vision unit 46 and the second vision unit 48 may be disposed side by side in the first direction X. The first vision unit 46 and the second vision unit 48 may identify ink droplets dispensed by the head 42. Each of the first vision unit 46 and the second vision unit 48 may be a camera including an image acquisition module.

The nozzle alignment unit 50 may be provided in the maintenance area 20. The nozzle alignment unit 50 may be provided between the first gantry 31 and the second gantry 32 when viewed from above. The nozzle alignment unit 50 may identify states of the nozzles 42a formed in the head 42. For example, the nozzle alignment unit 50 may include a moving rail 52 and a third vision unit 54. The moving rail 52 may be disposed such that the lengthwise direction thereof is parallel to the first direction X. The third vision unit 54 may linearly reciprocate in the first direction X that is the lengthwise direction of the moving rail 52. The third vision unit 54 may take an image of the nozzles 42a of the head 42 while moving in the lengthwise direction of the moving rail 52.

The fourth vision unit 60 may be installed on the third gantry 33 so as to be movable in the second direction Y that is the lengthwise direction of the third gantry 33. The fourth vision unit 60 may be a camera including an image acquisition module. The fourth vision unit 60 may obtain an image of the ink droplets I dispensed onto the second substrate S2 and may transfer the obtained image to the controller 80 to be described below. The controller 80 may analyze the image obtained by the fourth vision unit 60 and may calculate data for correction of the dispensing points of ink droplets dispensed by the head unit 40, the moving speed of the head 42, the moving speed of a substrate, and the like.

The controller 80 may control the substrate processing apparatus 100. The controller 80 may calculate data for correction of the dispensing points of ink droplets dispensed by the head unit 40, the moving speed of the head 42, the moving speed of a substrate, and the like, based on images (or, photos) taken and obtained by the first vision unit 46, the second vision unit 48, the third vision unit 54, and the fourth vision unit 60. The controller 80 may include a process controller, a user interface, and a storage unit. The process controller may be implemented with a microprocessor (a computer) that executes the control of the substrate processing apparatus 100. The user interface may include a keyboard through which an operator inputs a command to manage the substrate processing apparatus 100 or a display that visually displays an operational state of the substrate processing apparatus 100. The storage unit may store a process recipe, such as a control program for executing a process performed in the substrate processing apparatus 100 under the control of the process controller or a program for causing each component to execute a process according to various types of data and process conditions. The user interface and the storage unit may be connected to the process controller. The process recipe may be stored in a storage medium of the storage unit. The storage medium may be a hard disk, a portable disk such as CD-ROM or DVD, or a semiconductor memory such as a flash memory.

To accurately calculate data for correction of the dispensing points of ink droplets dispensed by the head unit 40, the moving speed of the head 42, the moving speed of a substrate, and the like, based on images (or, photos) taken and obtained by the first vision unit 46, the second vision unit 48, the third vision unit 54, and the fourth vision unit 60, it is important to accurately set the first vision unit 46, the second vision unit 48, the third vision unit 54, and the fourth vision 60. For example, the movement axes of the first vision unit 46 and the second vision unit 48 have to be accurately set to coincide with the second direction Y. For example, the first vision unit 46 and the second vision unit 48 have to be accurately set such that the direction in which the first vision unit 46 and the second vision unit 48 are arranged coincides with the first direction X. For example, the movement axis of the third vision unit 54 has to be set to accurately coincide with the first direction X. For example, the movement axis of the fourth vision unit 60 has to be set to accurately coincide with the second direction Y. Furthermore, the moving directions of the first substrate S1 and the second substrate S2 may be set to accurately coincide with the first direction X.

Figure 2:
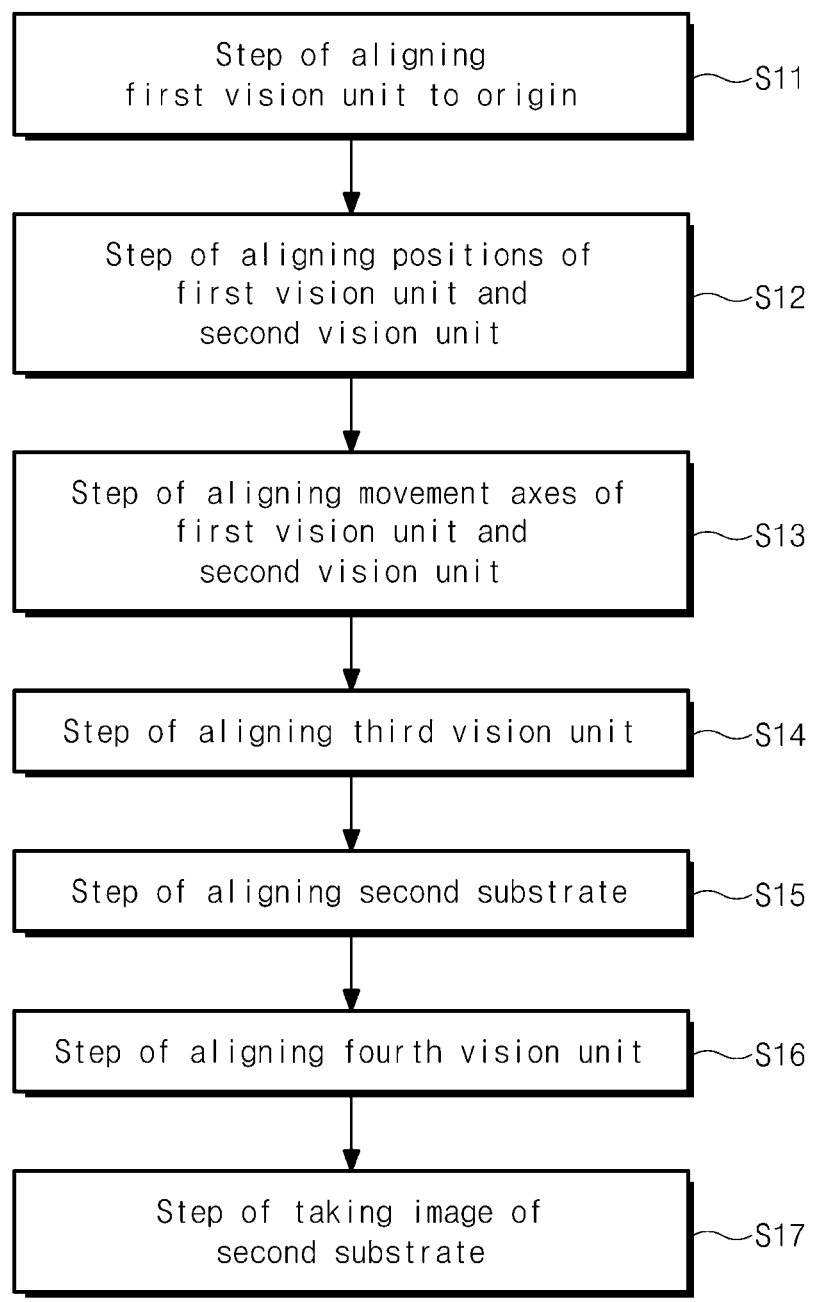
FIG. 2 is a flowchart illustrating a setting method for the substrate processing apparatus according to an embodiment of the inventive concept.

Hereinafter, a method for setting the substrate processing apparatus 100 having the head 42 for dispensing ink according to an embodiment of the inventive concept will be described. FIG. 2 is a flowchart illustrating the setting method for the substrate processing apparatus according to the embodiment of the inventive concept. Referring to FIG. 2, the setting method for the substrate processing apparatus 100 according to the embodiment of the inventive concept may include a step of aligning the first vision unit to the origin (S11), a step of aligning the positions of the first vision unit and the second vision unit (S12), a step of aligning the movement axes of the first vision unit and the second vision unit (S13), a step of aligning the third vision unit (S14), a step of aligning the second substrate (S15), a step of aligning the fourth vision unit (S16), and a step of taking an image of the second substrate (S17).

Figure 3:
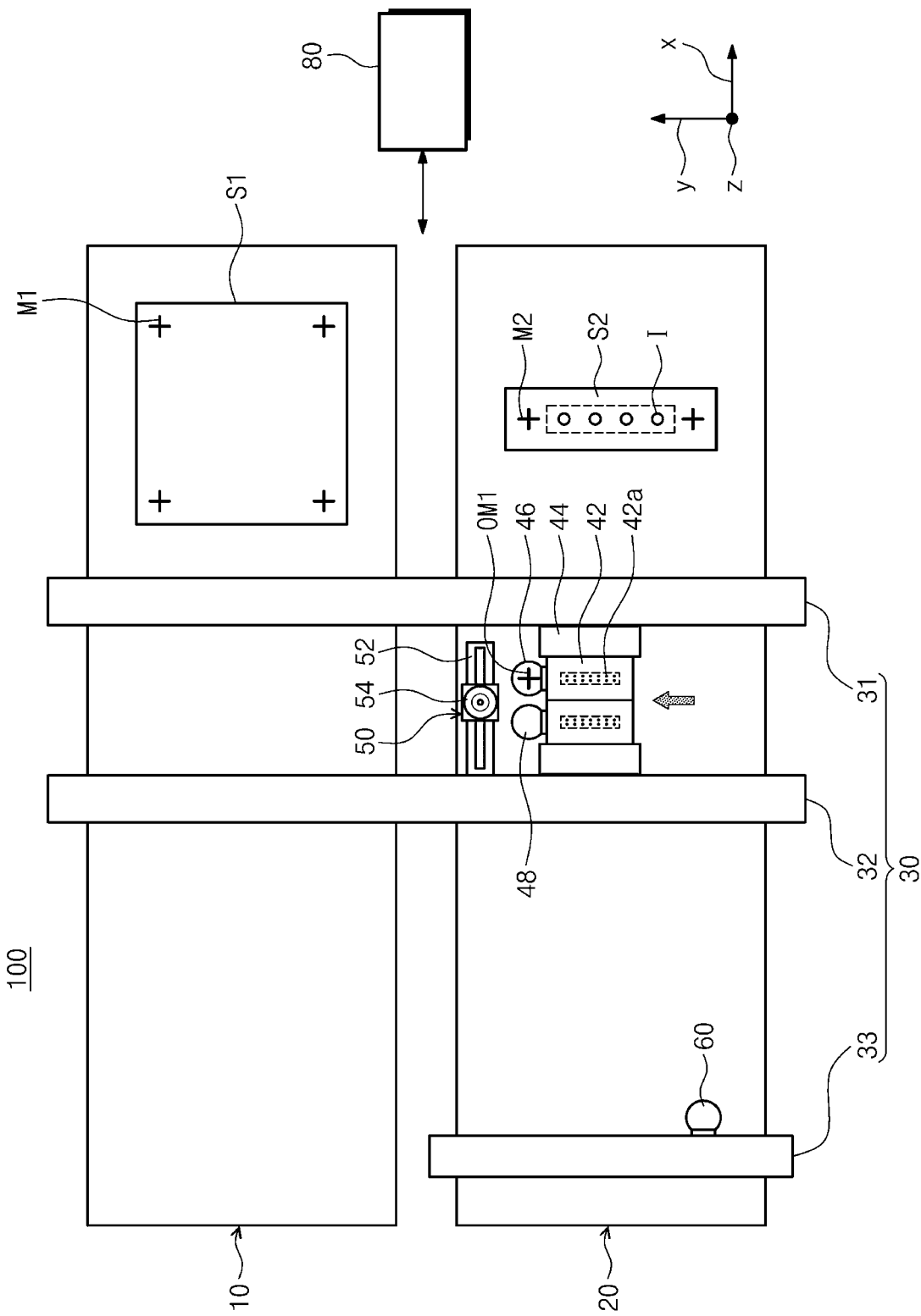
FIG. 3 is a view illustrating a state in which a step of aligning a first vision unit to an origin is performed in the substrate processing apparatus of FIG. 1.
Figure 4:
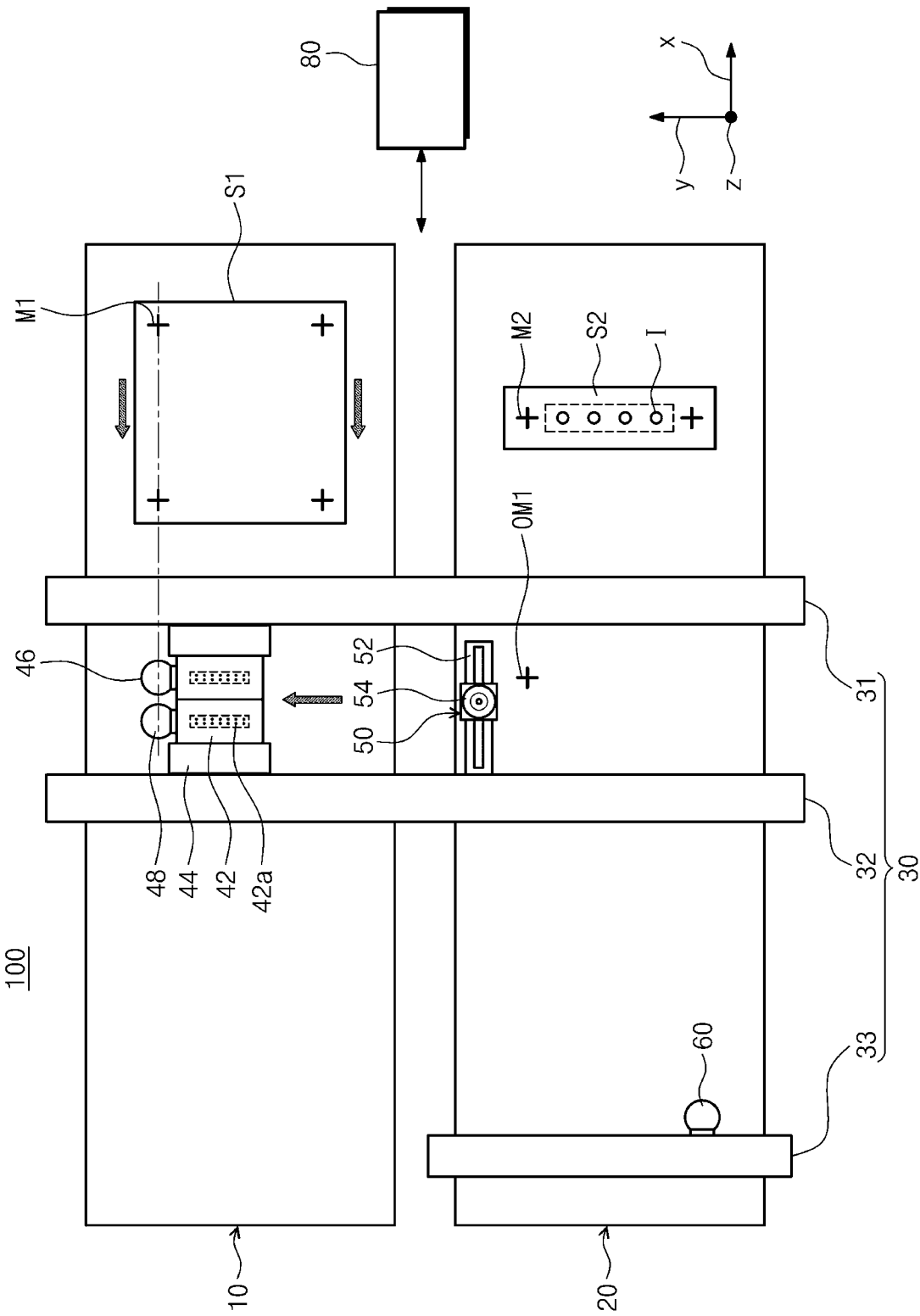
FIG. 4 is a view illustrating a state in which a step of aligning positions of the first vision unit and a second vision unit is performed in the substrate processing apparatus of FIG. 1.
Figure 5:
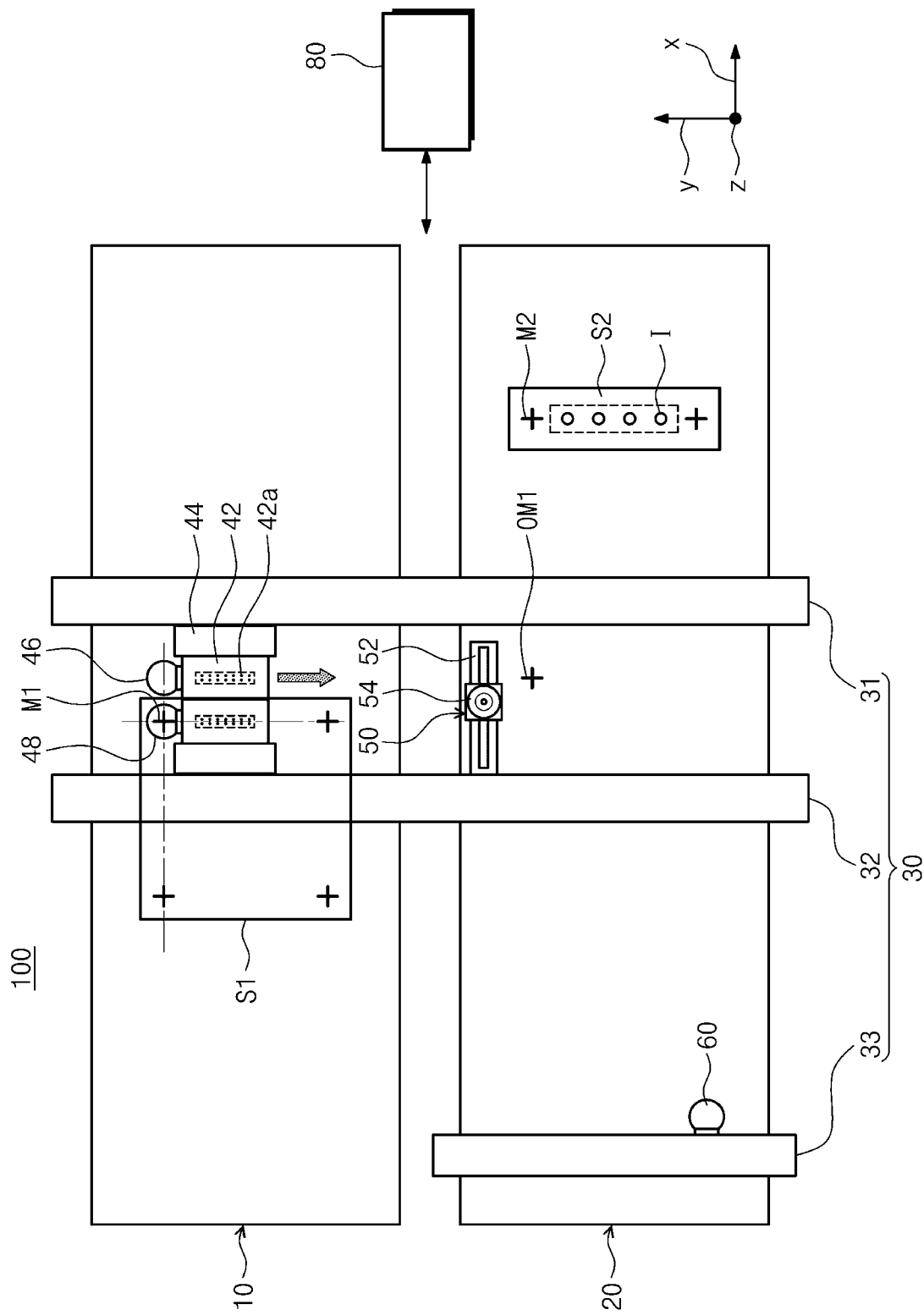
FIG. 5 is a view illustrating a state in which a step of aligning movement axes of the first vision unit and the second vision unit is performed in the substrate processing apparatus of FIG. 1.
Figure 6:
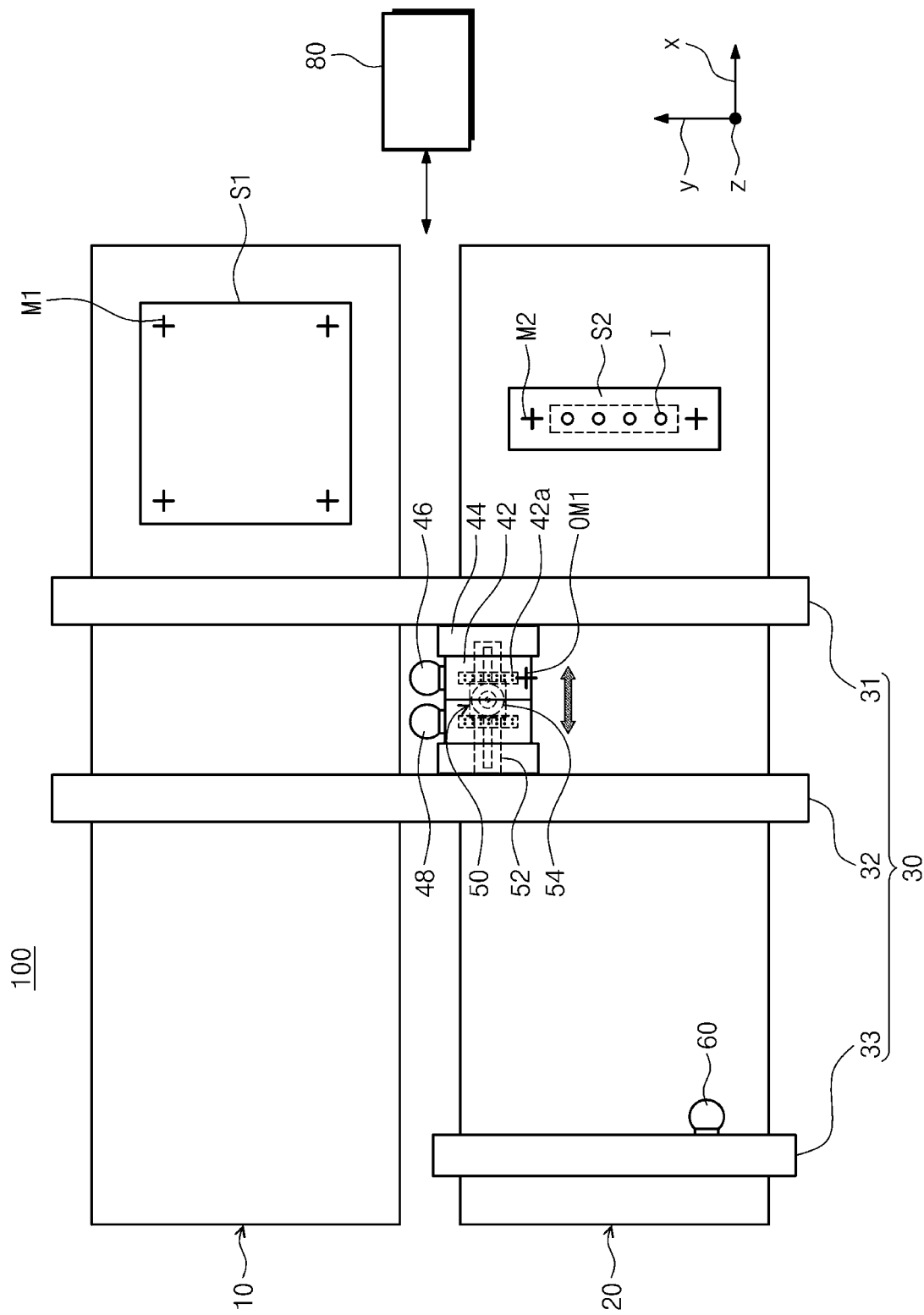
FIG. 6 is a view illustrating a state in which a step of aligning a third vision unit is performed in the substrate processing apparatus of FIG. 1.
Figure 7:
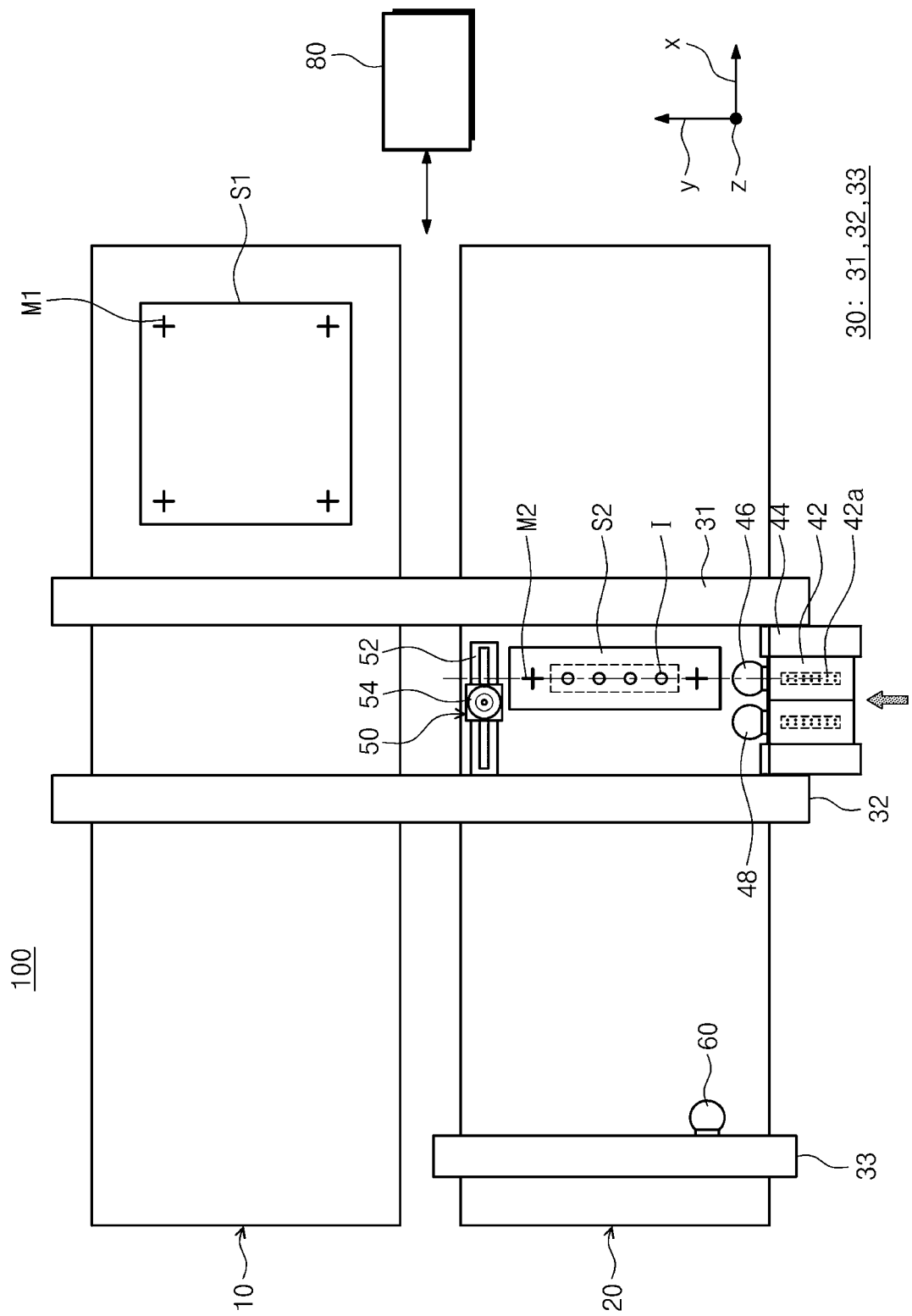
FIG. 7 is a view illustrating a state in which a step of aligning a second substrate is performed in the substrate processing apparatus of FIG. 1.
Figure 8:
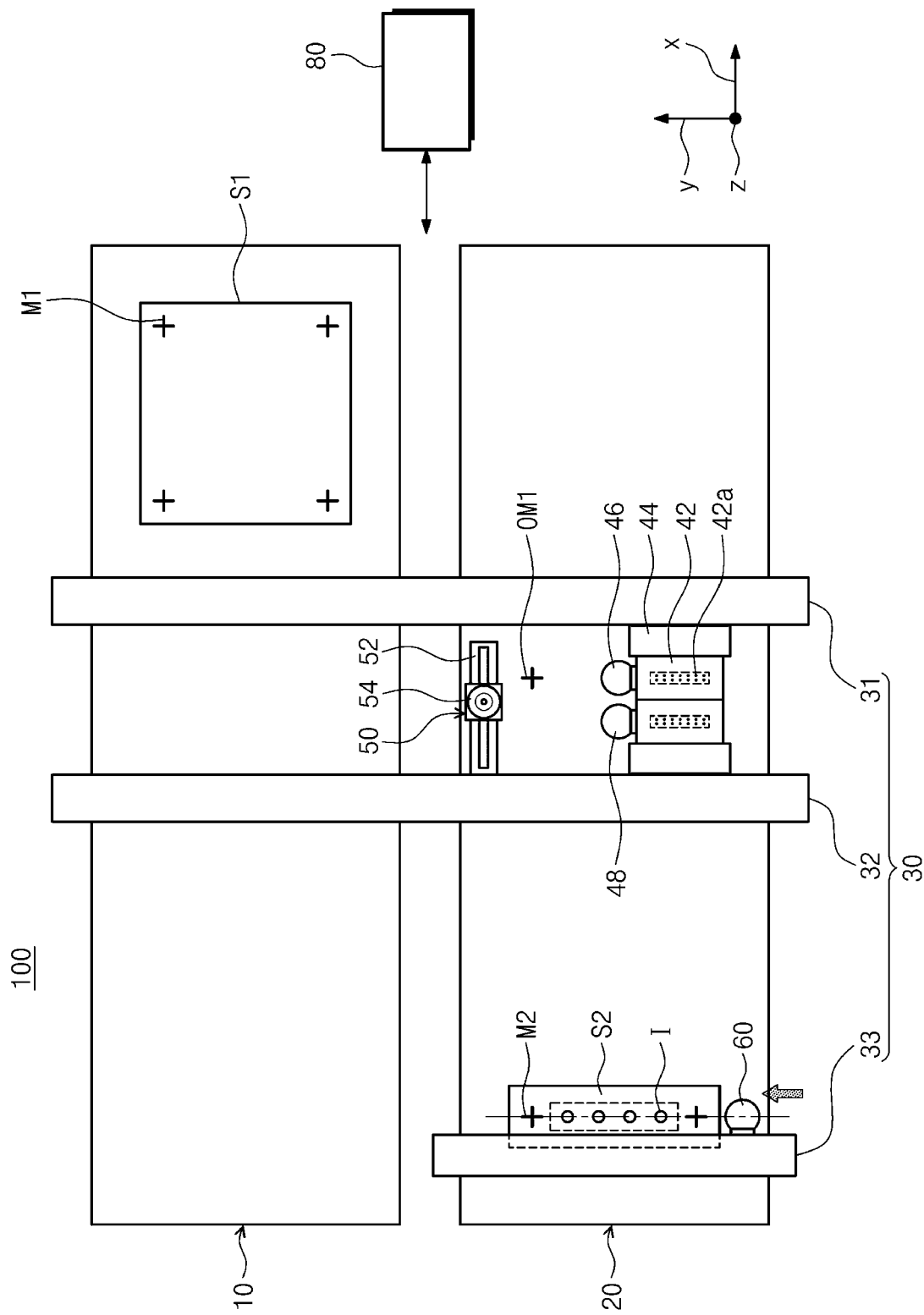
FIG. 8 is a view illustrating a state in which a step of aligning a fourth vision unit is performed in the substrate processing apparatus of FIG. 1.

In the step of aligning the first vision unit to the origin (S11), the position of the first vision unit 46 may be aligned by moving the first vision unit 46 above the first reference mark OM1 and taking, by the first vision unit 46, an image of the first reference mark OM1 (refer to FIG. 3). That is, the first vision unit 46 may be aligned to the origin after the step of aligning the first vision unit to the origin (S11) is performed.

In the step of aligning the positions of the first vision unit and the second vision unit (S12), the head unit 40 may be moved to the printing area 10. Thereafter, the first substrate S1 may be moved in the first direction X. At this time, each of the first vision unit 46 and the second vision unit 48 may take an image of the first alignment marks M1 made on the first substrate S1 and arranged in the first direction X. The images obtained by the first vision unit 46 and the second vision unit 48 may differ from each other if the first vision unit 46 and the second vision unit 48 are not arranged side by side in the first direction X in which the first substrate S1 is transported. In this case, the positions of the first vision unit 46 and/or the second vision unit 48 are aligned such that the first vision unit 46 and the second vision unit 48 are arranged side by side in the first direction X (refer to FIG. 4). That is, the first vision unit 46 and the second vision unit 48 are arranged side by side in the first direction X after the step of aligning the positions of the first vision unit and the second vision unit (S12) is performed.

In the step of aligning the movement axes of the first vision unit and the second vision unit (S13), the first vision unit 46 and the second vision unit 48 may be moved in the second direction Y. The first vision unit 46 and the second vision unit 48, while being moved in the second direction Y, may take images of the first alignment marks M1 made on the first substrate S1 in the second direction Y. The images obtained by the first vision unit 46 and the second vision unit 48 may differ from each other if the movement axes of the first vision unit 46 and the second vision unit 48 do not coincide with the second direction Y. In this case, the movement axes of the first vision unit 46 and the second vision unit 48 (e.g., the first gantry 31 and the second gantry 32) are aligned to coincide with the second direction Y (refer to FIG. 5). That is, the movement axes of the first vision unit 46 and the second vision unit 48 are aligned in the second direction Y after the step of aligning the movement axes of the first vision unit and the second vision unit (S13) is performed.

In the step of aligning the third vision unit (S14), the head unit 40 is moved to the maintenance area 20. For example, in the step of aligning the third vision unit (S14), the head 42 of the head unit 40 is moved above the nozzle alignment unit 50. Thereafter, the third vision unit 54 is moved in the first direction X that is the lengthwise direction of the moving rail 52 (refer to FIG. 6). Because the positions and movement axes of the first vision unit 46 and the second vision unit 48 were aligned, the position and movement axis of the head 42 coupled with the first vision unit 46 and the second vision unit 48 may also be aligned. The third vision unit 54 takes an image of the nozzles 42a, and when the arrangement direction of the nozzles 42a in the obtained image does not coincide with the first direction X, it is determined that the movement axis of the third vision unit 54 is not aligned. In this case, the movement axis of the third vision unit 54 (e.g., the moving rail 52) is aligned. That is, the movement axis of the third vision unit 54 is aligned in the first direction X after the step of aligning the third vision unit (S14) is performed.

In the step of aligning the second substrate (S15), the second substrate S2 onto which the ink droplets I are dispensed is moved below the head 42 while the head 42 moves in the second direction Y. The first vision unit 46 and/or the second vision unit 48, while moving in the second direction Y, may take an image of the ink droplets I dispensed onto the second substrate S2 (refer to FIG. 7). Because the movement axis and position of the head 42 were aligned, the ink droplets I may be arranged side by side in the second direction Y in the image obtained by the first vision unit 46 and/or the second vision unit 48, if the movement axis of the second substrate S2 or the position of the second substrate S2 is aligned. If the arrangement direction of the ink droplets I in the image obtained by the first vision unit 46 and/or the second vision unit 48 does not coincide with the second direction Y, at least one of the position of the second substrate S or the movement axis of the second substrate S2 may be aligned such that the arrangement direction of the ink droplets I coincides with the second direction Y.

Furthermore, in the case of dispensing the ink droplets I onto the second substrate S2 in the step of aligning the second substrate (S15), the ink droplets I dispensed by the head 42 may be arranged side by side in the second direction Y because the head 42 was aligned. Thereafter, the position of the second substrate S2 or the movement axis of the second substrate S2 may be aligned depending on whether the ink droplets I and the second alignment marks M2 are arranged side by side in the second direction Y.

In the step of aligning the fourth vision unit (S16), the second substrate S2 is moved below the fourth vision unit 60. The fourth vision unit 60, while moving in the second direction Y, takes an image of the ink droplets I dispensed onto the second substrate S2. Because the second substrate S2 was aligned, the ink droplets I may be arranged side by side in the second direction Y in the image obtained by the fourth vision unit 60, if the movement axis of the fourth vision unit 60 is aligned in the second direction Y. If not, the movement axis of the fourth vision unit 60 (e.g., the third gantry 33) is aligned to coincide with the second direction Y (refer to FIG. 8).

In the step of taking an image of the second substrate (S17), the aligned fourth vision unit 60 takes an image of the second substrate S2. The obtained image is transferred to the controller 80. The controller 80 may calculate correction data for correction of the dispensing point of the head unit 40, the amount of ink dispensed, the moving speed of the head 42, and the like, based on the transferred image. That is, according to the above-described embodiment, the first vision unit 46, the second vision unit 48, the third vision unit 54, and the fourth vision unit 60 are accurately set, and the position and/or movement axis of the first substrate S1 or the second substrate S2 is aligned. Accordingly, images obtained by the first vision unit 46, the second vision unit 48, the third vision unit 54, and the fourth vision unit 60 have high accuracy. Thus, an error in the correction data calculated by the controller 80 may be minimized.

Figure 9:
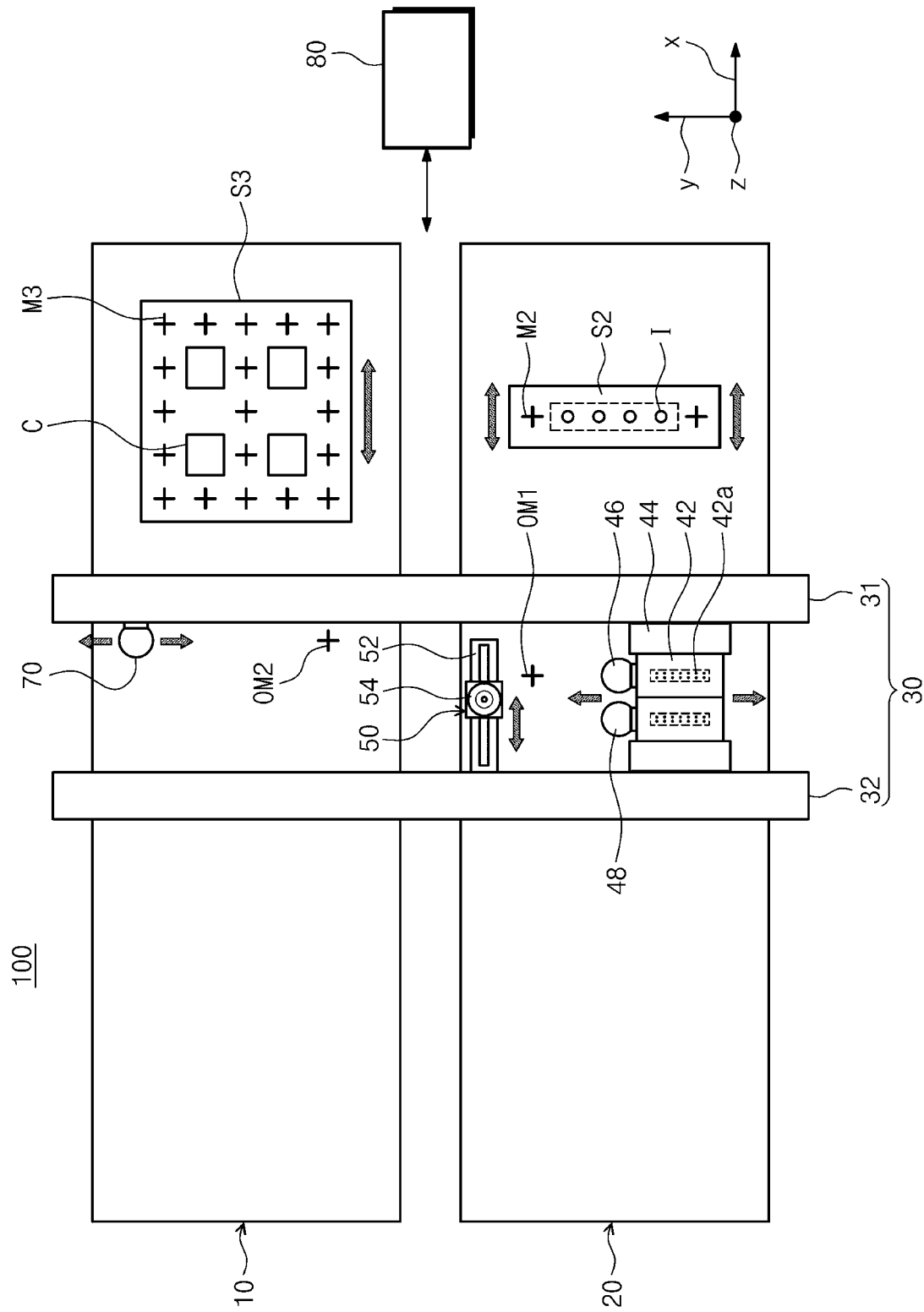
FIG. 9 is a view illustrating a substrate processing apparatus according to another embodiment of the inventive concept.

FIG. 9 is a view illustrating a substrate processing apparatus according to another embodiment of the inventive concept. The substrate processing apparatus 100 according to the other embodiment of the inventive concept is substantially similar to the substrate processing apparatus 100 according to the above-described embodiment. The following description will be focused on a difference between the substrate processing apparatus 100 according to the other embodiment and the substrate processing apparatus 100 according to the above-described embodiment.

The substrate processing apparatus 100 according to the other embodiment may further include a fifth vision unit 70. The fifth vision unit 70 may be a camera including an image acquisition module. The fifth vision unit 70 may be installed at a height different from that of the head unit 40 so as not to interfere with a movement of the head unit 40. The fifth vision unit 70 may be installed on a first gantry 31 or a second gantry 32 and may be moved in the second direction Y. Although FIG. 9 illustrates an example that one fifth vision unit 70 is provided, the inventive concept is not limited thereto, and a plurality of fifth vision units 70 may be provided.

A second reference mark OM2 may be made on a printing area 10. The second reference mark OM2 may be made on the printing area 10 of the substrate processing apparatus 100 and may be fixed in one position. Although FIG. 9 illustrates an example that one second reference mark OM2 is provided, the positions and number of second reference marks OM2 may be changed in various ways. The fifth vision unit 70 may have a radius of movement (that is, stroke) sufficient to take an image of the second reference mark OM2.

A third substrate S3 may be provided on the printing area 10. The third substrate S3 may be moved in the first direction X. A plurality of third alignment marks M3 may be made on the third substrate S3. The third substrate S3 may include a plurality of cells C, and when viewed from above, at least one of the third alignment marks M3 may be made between the plurality of cells C. The third alignment marks M3 may be arranged in the first direction X and the second direction Y.

Figure 10:
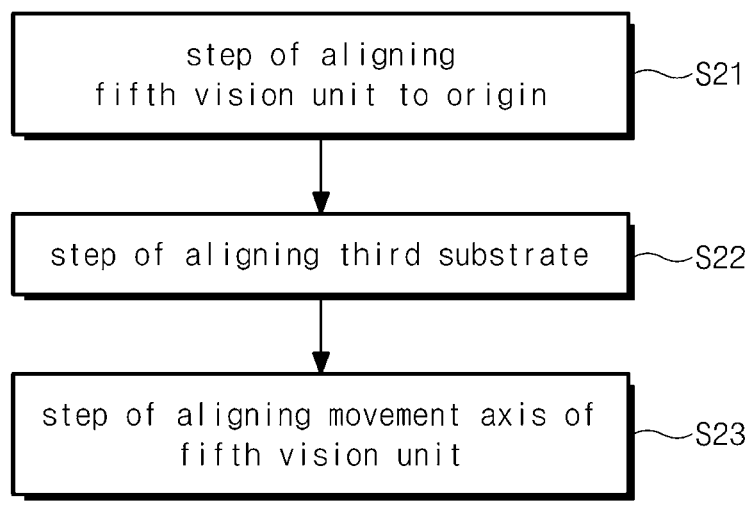
FIG. 10 is a view illustrating a setting method for the substrate processing apparatus according to another embodiment of the inventive concept.
Figure 11:
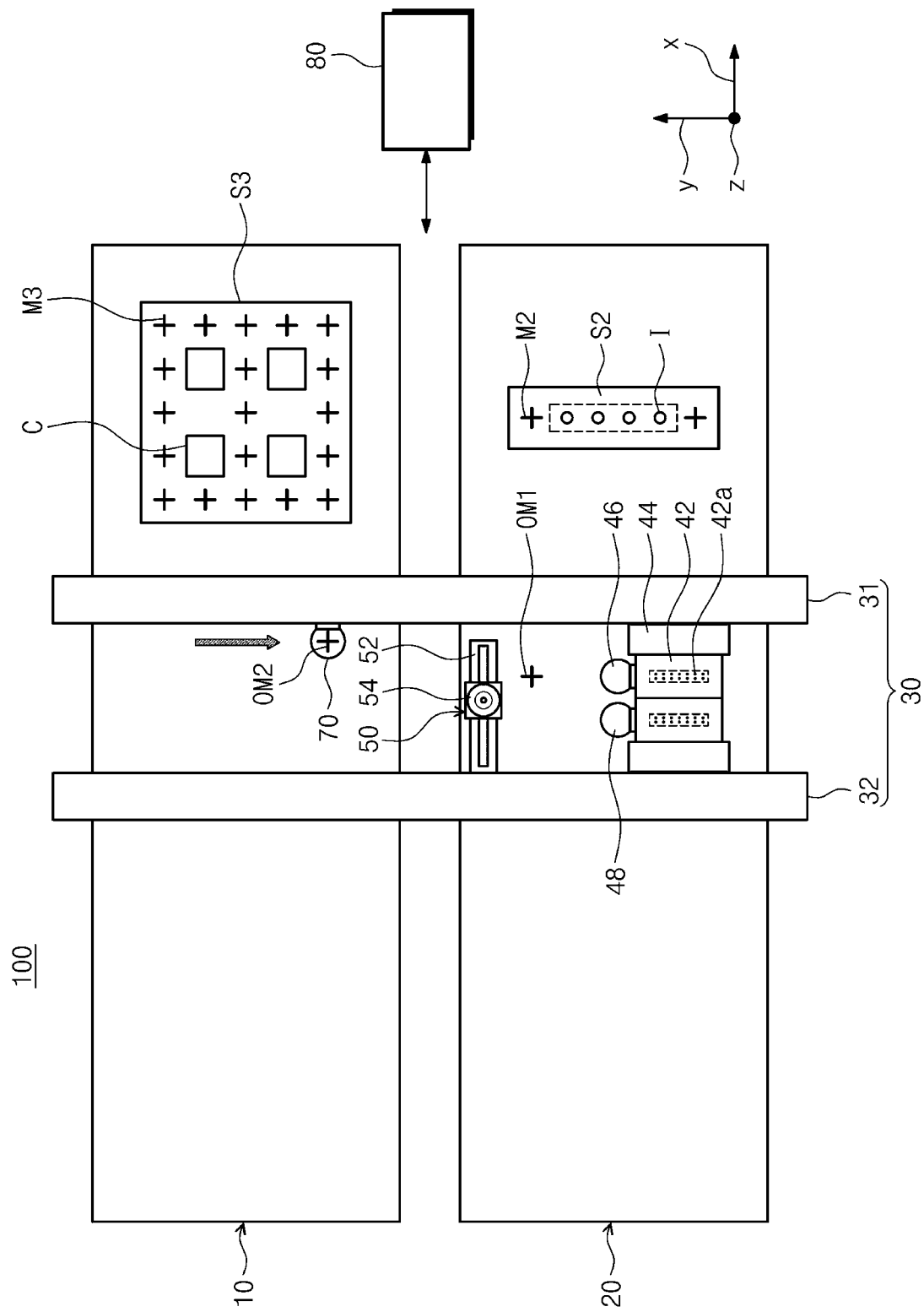
FIG. 11 is a view illustrating a state in which a step of aligning a fifth vision unit to an origin is performed in the substrate processing apparatus of FIG. 9.
Figure 12:
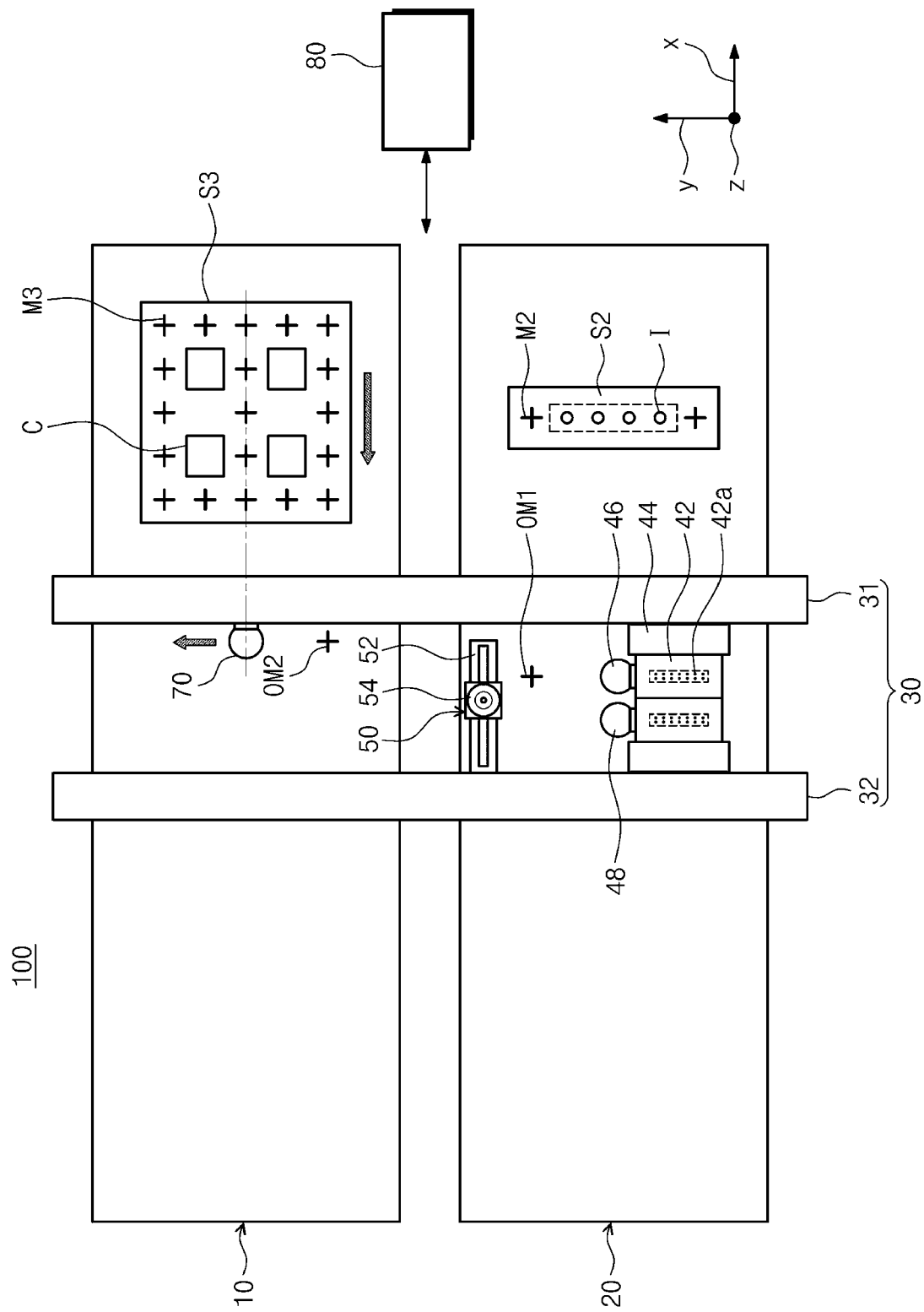
FIG. 12 is a view illustrating a state in which a step of aligning a third substrate is performed in the substrate processing apparatus of FIG. 9.

FIG. 10 is a flowchart illustrating a setting method for the substrate processing apparatus according to another embodiment of the inventive concept. Referring to FIG. 10, the setting method for the substrate processing apparatus 100 according to the other embodiment of the inventive concept may include a step of aligning the fifth vision unit to the origin (S21), a step of aligning the third substrate (S22), and a step of aligning a movement axis of the fifth vision unit (S23).

In the step of aligning the fifth vision unit to the origin (S21), the position of the fifth vision unit 70 may be aligned by moving the fifth vision unit 70 above the second reference mark OM2 and taking, by the fifth vision unit 70, an image of the second reference mark OM2. Accordingly, the fifth vision unit 70 may be aligned to the origin (refer to FIG. 11). At this time, a controller 80 may correct a slight deviation by software.

In the step of aligning the third substrate (S22), the fifth vision unit 70 may take an image of the third alignment marks M3 while the third substrate S3 is moved in the first direction X. Because the fifth vision unit 70 was aligned to the origin, the third alignment marks M3 photographed by the fifth vision unit 70 may be arranged side by side in the first direction X if the movement axis of the third substrate S3 is oriented in the first direction X. If not, the position of the third substrate S3 or the movement axis of the third substrate S3 is aligned such that the movement axis of the third substrate S3 is oriented in the first direction X (refer to FIG. 12).

In the step of aligning the movement axis of the fifth vision unit (S23), the fifth vision unit 70 may take an image of the third alignment marks M3 while moving in the second direction Y. The third alignment marks M3 photographed by the fifth vision unit 70 may be arranged side by side in the second direction Y if the movement axis of the fifth vision unit 70 is oriented in the second direction Y. If not, the movement axis of the fifth vision unit 70 is aligned such that the movement axis of the fifth vision unit 70 is oriented in the second direction Y (refer to FIG. 13).

When a plurality of fifth vision units 70 are provided as described above, it is important to accurately align the gap between the fifth vision units 70. For example, the gap between the fifth vision units 70 is preferably the same as the gap between the third alignment marks M3. After the step of aligning the movement axis of the fifth vision unit (S23) is performed, the third substrate S3 may be moved in the first direction X again, each of the plurality of fifth vision units 70 may take an image of the third alignment marks M3, and the positions of the plurality of fifth vision units 70 may be adjusted such that the gap between the plurality of fifth vision units 70 is the same as the gap between the third alignment marks M3.

When the first reference mark OM1 and the second reference mark OM2 are made in a physical shape on the printing area 10 or the maintenance area 20, images taken by the vision units may be distorted in some cases, the vision units may collide with the first reference mark OM1 and the second reference mark OM2 while moving, or the substrates may collide with the first reference mark OM1 and the second reference mark OM2 while moving. Accordingly, in the inventive concept, the first reference mark OM1 and the second reference mark OM2 may be made on the printing area 10 or the maintenance area 20 by a project beam. When the first reference mark OM1 and the second reference mark OM2 are made by the project beam, interference does not occur even though the substrates move to the positions where the substrates overlap the first reference mark OM1 and the second reference mark OM2.

According to the embodiments of the inventive concept, the positions and/or movement axes of the vision units of the substrate processing apparatus may be aligned to enable the vision units to accurately obtain images.

In addition, according to the embodiments of the inventive concept, the vision units of the substrate processing apparatus may be accurately set, and a control signal of the head may be corrected through images obtained by the vision units.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for setting a substrate processing apparatus having a head for dispensing ink, the method comprising:
    aligning a position of a first vision unit, by moving the first vision unit above a reference mark and taking, by the first vision unit, an image of the reference mark, wherein the first vision unit identifies ink droplets dispensed by the head, and the reference mark is made on the substrate processing apparatus and fixed in one position; and
    aligning positions of the first vision unit and a second vision unit and/or movement axes of the first vision unit and the second vision unit by taking, by the first vision unit and the second vision unit, an image of alignment marks, wherein the second vision unit identifies the ink droplets dispensed by the head and is disposed side by side with the first vision unit, and the alignment marks are made on a first substrate moved in a first direction and are spaced apart from each other in the first direction and/or a second direction perpendicular to the first direction when viewed from above.

2. The method of claim 1, wherein by moving the first substrate in the first direction and taking, by the first vision unit and the second vision unit, an image of the alignment marks made in the first direction, the positions of the first vision unit and the second vision unit are aligned such that the first vision unit and the second vision unit are arranged in the first direction.

3. The method of claim 1, wherein the movement axes of the first vision unit and the second vision unit are aligned in the second direction, by moving the first vision unit and the second vision unit and taking, by the first vision unit and the second vision unit, an image of the alignment marks made in the second direction.

4. The method of claim 1, wherein the first vision unit and the second vision unit are installed on the head, and wherein the method further comprises:
    moving the head above a nozzle alignment unit including a third vision unit configured to identify states of nozzles formed in the head and a moving rail configured to move the third vision unit;
    taking, by the third vision unit, an image of the nozzles while moving in a lengthwise direction of the moving rail; and
    aligning a movement axis of a third vision unit in the first direction or the second direction.

5. The method of claim 1, wherein the head dispenses the ink droplets onto a second substrate while moving in the second direction, and
wherein the method further comprises:
    determining whether the ink droplets are arranged in the second direction, by taking, by the first vision unit and/or the second vision unit, an image of the ink droplets while moving in the second direction; and
    aligning at least one of a position of the second substrate or a movement axis of the second substrate such that an arrangement direction of the ink droplets coincides with the second direction.

6. The method of claim 5, further comprising:
    moving the second substrate below a fourth vision unit configured to identify the ink droplets;
    taking, by the fourth vision unit, an image of the ink droplets; and
    aligning a movement axis of the fourth vision unit in the second direction.

7. The method of claim 5, wherein the first substrate is provided on a printing area where the head dispenses the ink to perform a printing process, and
wherein the second substrate is provided on a maintenance area where maintenance of the head is performed.

8. The method of claim 7, wherein the reference mark is made on the maintenance area.

9. The method of claim 7, wherein the printing area and the maintenance area are arranged in the section direction.

10. A method for setting a substrate processing apparatus including a printing area, a maintenance area disposed side by side with the printing area in a second direction when viewed from above, a head configured to move between the printing area and the maintenance area and dispense ink droplets, a first vision unit coupled with the head and configured to identify the ink droplets dispensed by the head, and a second vision unit coupled with the head so as to be disposed side by side with the first vision unit and configured to identify the ink droplets dispensed by the head, the method comprising:
    aligning a position of the first vision unit, by moving the first vision unit above a reference mark and taking, by the first vision unit, an image of the reference mark, wherein the reference mark is made on the printing area or the maintenance area and fixed in one position; and
    aligning positions of the first vision unit and the second vision unit and/or movement axes of the first vision unit and the second vision unit by taking, by the first vision unit and the second vision unit, an image of alignment marks, wherein the alignment marks are made on a first substrate moved in a first direction perpendicular to the second direction when viewed from above and are spaced apart from each other in the first direction and the second direction.

11. The method of claim 10, wherein by moving the first substrate in the first direction and taking, by the first vision unit and the second vision unit, an image of the alignment marks made in the first direction, the positions of the first vision unit and the second vision unit are aligned such that the first vision unit and the second vision unit are arranged in the first direction.

12. The method of claim 10, wherein the movement axes of the first vision unit and the second vision unit are aligned in the second direction, by moving the first vision unit and the second vision unit and taking, by the first vision unit and the second vision unit, an image of the alignment marks made in the second direction.

13. The method of claim 10, wherein the substrate processing apparatus further includes a nozzle alignment unit including a third vision unit configured to identify states of nozzles formed in the head and a moving rail configured to move the third vision unit, and
wherein the method further comprises:
moving the head above the nozzle alignment unit;
taking, by the third vision unit, an image of the nozzles while moving in a lengthwise direction of the moving rail; and
aligning a movement axis of the third vision unit in the first direction.

14. The method of claim 10, wherein the head dispenses the ink droplets onto a second substrate while moving in the second direction, and
wherein the method further comprises:
determining whether the ink droplets are arranged in the second direction, by taking, by the first vision unit and the second vision unit, an image of the ink droplets while moving in the second direction; and
aligning at least one of a position of the second substrate or a movement axis of the second substrate such that an arrangement direction of the ink droplets coincides with the second direction.

15. The method of claim 14, further comprising:
moving the second substrate below a fourth vision unit configured to identify the ink droplets;
taking, by the fourth vision unit, an image of the ink droplets; and
aligning a movement axis of the fourth vision unit in the second direction.

16. The method of claim 14, wherein the second substrate is provided on the maintenance area, and
wherein the first substrate is provided on the printing area.

17. A method for setting a substrate processing apparatus having a head for dispensing ink, the method comprising:
aligning a position of at least one vision unit, by moving the vision unit above a reference mark and taking, by the vision unit, an image of the reference mark, wherein the vision unit takes an image of a substrate, and the reference mark is made on the substrate processing apparatus and fixed in one position; and
aligning at least one of a movement axis of the vision unit, a position of the substrate, or a movement axis of the substrate, by moving the vision unit or the substrate in a state in which the substrate having alignment marks made thereon is located under the vision unit and taking, by the vision unit, an image of the alignment marks.

18. The method of claim 17, wherein the substrate further includes a plurality of cells, and
wherein at least one of the alignment marks is made between the plurality of cells when viewed from above.

19. The method of claim 17, wherein the alignment marks are arranged in a first direction in which the substrate is transported and a second direction perpendicular to the first direction when viewed from above, and
wherein the vision unit includes a plurality of vision units arranged in the second direction.

20. The method of claim 17, wherein the reference mark is made by a project beam.

* * * * *